US009598938B2

United States Patent
Colvin et al.

(10) Patent No.: US 9,598,938 B2
(45) Date of Patent: Mar. 21, 2017

(54) METHOD AND SYSTEM OF PLANNING LATERAL WELLBORES WITHIN IRREGULAR BOUNDARIES

(71) Applicant: Landmark Graphics Corporation, Houston, TX (US)

(72) Inventors: Richard D. Colvin, Dripping Springs, TX (US); DeWayne E. Pratt, Littleton, CO (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 14/763,469

(22) PCT Filed: Feb. 18, 2013

(86) PCT No.: PCT/US2013/026565
§ 371 (c)(1),
(2) Date: Jul. 24, 2015

(87) PCT Pub. No.: WO2014/126589
PCT Pub. Date: Aug. 21, 2014

(65) Prior Publication Data
US 2015/0361767 A1  Dec. 17, 2015

(51) Int. Cl.
*G06G 7/48* (2006.01)
*E21B 41/00* (2006.01)
*E21B 43/30* (2006.01)

(52) U.S. Cl.
CPC .......... *E21B 41/0092* (2013.01); *E21B 43/30* (2013.01); *E21B 43/305* (2013.01)

(58) Field of Classification Search
CPC ..... E21B 41/0092; E21B 43/305; E21B 43/30
(Continued)

(56) References Cited

U.S. PATENT DOCUMENTS

2006/0151214 A1   7/2006  Prange et al.
2006/0266517 A1  11/2006  Stayton
(Continued)

FOREIGN PATENT DOCUMENTS

WO   WO-2012018429 A1   2/2012

OTHER PUBLICATIONS

International Search Report and Written Opinion, Oct. 16, 2013, 9 pages; Korean International Searching Authority.
(Continued)

*Primary Examiner* — Saif Alhija

(57) ABSTRACT

Planning lateral wellbores within irregular boundaries. At least some of the illustrative embodiments are methods including: logically dividing an irregular polygon into a plurality of contiguous sub-areas, the irregular polygon representing an outer boundary of mineral rights; planning a first plurality of layouts of lateral wellbores residing in a first sub-area, each layout along a distinct azimuthal direction; selecting a layout of the first plurality of layouts based on a selection criteria, the selecting creates a first selected layout; planning a second plurality of layouts of lateral wellbores residing in a second sub-area, each layout of the second plurality of layouts along a distinct azimuthal direction; selecting a layout of the second plurality of layouts based on a selection criteria, the selecting creates a second selected layout; creating an overall layout for the irregular polygon by combining the first and second selected layouts; and displaying the overall layout on a display device.

25 Claims, 7 Drawing Sheets

(58) Field of Classification Search
USPC .................................................. 703/1, 9, 10
See application file for complete search history.

(56) References Cited

U.S. PATENT DOCUMENTS

| | | |
|---|---|---|
| 2008/0105045 A1 | 5/2008 | Woro |
| 2010/0191516 A1 | 7/2010 | Benish et al. |
| 2010/0243328 A1 | 9/2010 | Rodriguez Herrera |
| 2011/0087471 A1* | 4/2011 | Postl .................. E21B 49/00 703/2 |
| 2013/0073209 A1 | 3/2013 | Colvin et al. |

OTHER PUBLICATIONS

Oksanen,T. and Visala,A., Path Planning Algorithms for Agricultural Machines, Jul. 2007, 19 pages, vol. IX, Agricultural Engineering International: the CIGR Ejournal. Manuscript ATOE 07 009.
Zandonadi, Rodrigo S., Computational Tools for Improving Route Planning in Agricultural Field Operations, 2012, 125 pages, University of Kentucky UKnowledge.

* cited by examiner

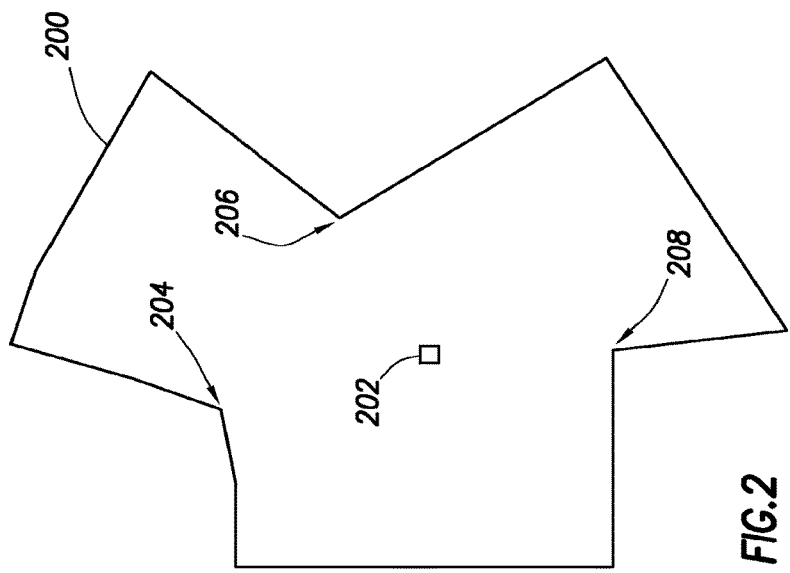
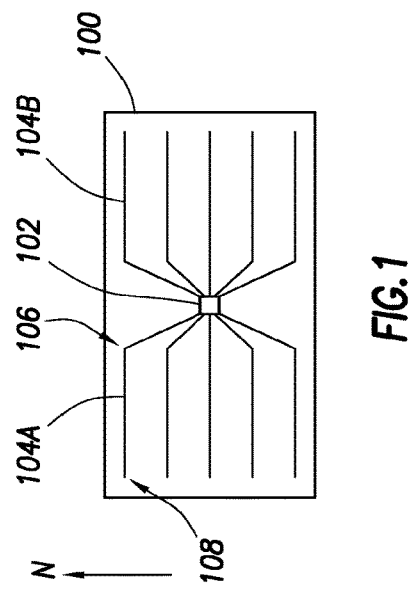

US 9,598,938 B2

METHOD AND SYSTEM OF PLANNING LATERAL WELLBORES WITHIN IRREGULAR BOUNDARIES

CROSS-REFERENCE TO RELATED APPLICATIONS

This application is a U.S. National Stage patent application of International Patent Application No. PCT/US2013/026565, filed on Feb. 18, 2013, the benefit of which is claimed and the disclosure of which is incorporated herein by reference in its entirety.

BACKGROUND

In recent years shale reservoirs have been the primary focus of new exploration and production in the hydrocarbon industry. Shale formations present additional challenges over traditional formations (e.g., sandstone). For example, in many cases only portions of a shale formation hydraulically fractured produce hydrocarbons in commercially viable quantities. It follows that the layout of wells within a shale formation in many cases is a series of wells that are substantially parallel. However, lease lines for mineral rights rarely define nice squares or rectangles, and thus planning the layout of wells for a shale formation where the layout provides sufficient drainage of the shale formation at an economically viable price can be a difficult and time consuming process.

BRIEF DESCRIPTION OF THE DRAWINGS

For a detailed description of exemplary embodiments, reference will now be made to the accompanying drawings in which:

FIG. 1 shows an overhead view of an a planned layout of lateral wellbores;

FIG. 2 shows an overhead view of an example boundary;

NOTATION AND NOMENCLATURE

Figure 3:
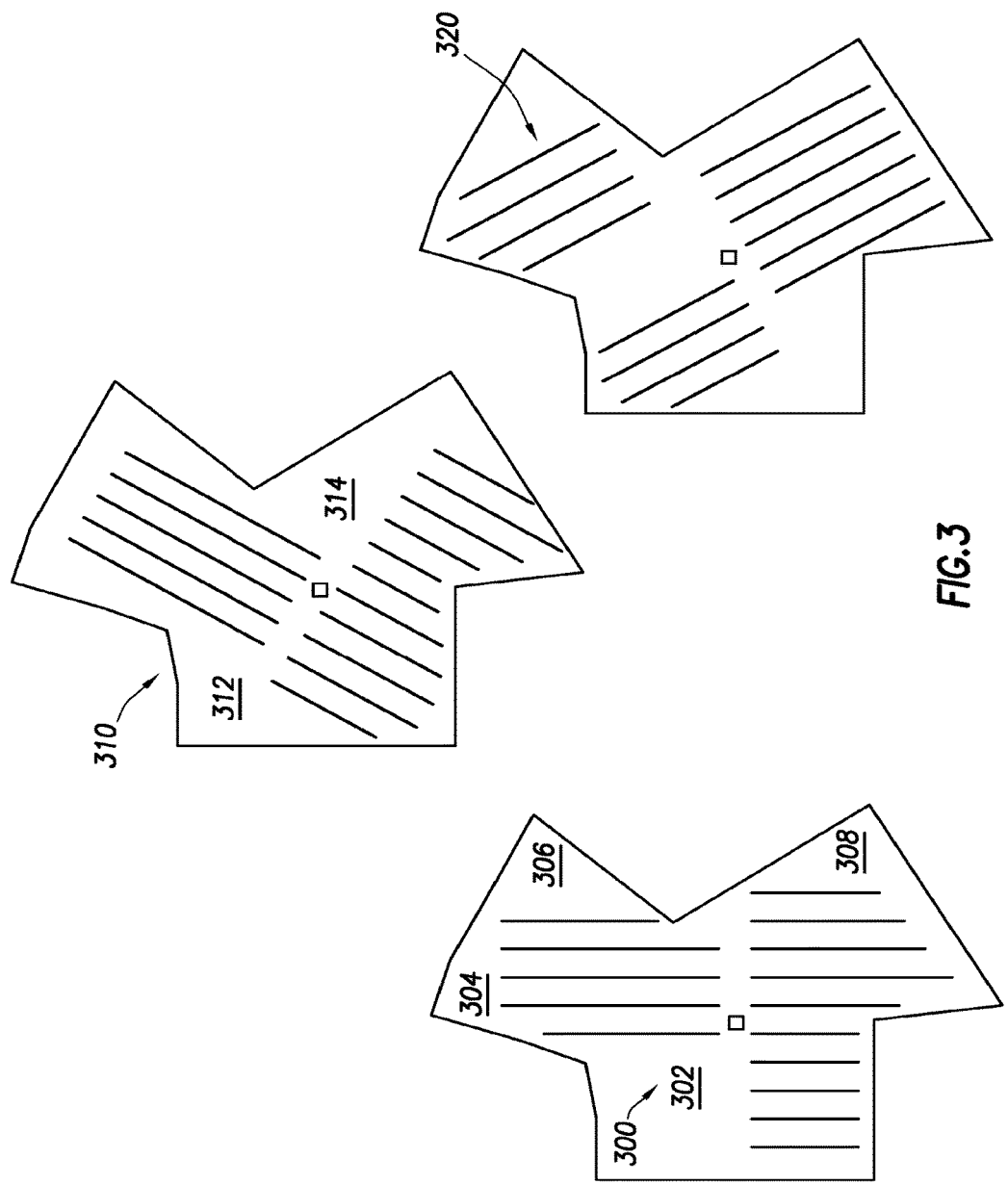
FIG. 3 shows overhead views of a set of boundaries, each boundary having a planned layout according to related-art methods.

Certain terms are used throughout the following description and claims to refer to particular system components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Irregular polygon" shall mean the outer boundary of a shape where the shape defines a closed path, an interior area, and at least three sides (with at least one straight side).

"Azimuthal direction", in relation to a planned or actual layout of a lateral wellbore, shall mean a direction relative to a reference direction (such as true north). The direction of drilling of a substantially horizontal portion of a lateral wellbore within a shale formation shall be considered the azimuthal direction of the wellbore. Reciprocal headings (e.g., the direction opposite the direction of drilling, 90 degrees and 270 degrees, 10 degrees and 190 degrees) are considered the same azimuthal direction.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various example systems are directed to a computer-implemented method of designing the layout of lateral wellbores within the boundary of mineral rights. More particularly, example systems implement an automated method comprising logically dividing an irregular polygon that defines the outer boundary of mineral rights (the logically dividing defines a set of sub-areas), planning the layout of lateral wellbores with each sub-area, and then creating an overall layout based on the layouts determined for each sub-area. In some example layouts, the azimuthal direction of the layout of the lateral wellbores (e.g., the cardinal direction referring to true north) in each sub-area is different such that more thorough extraction of hydrocarbons from the shale formation can be achieved. The specification first turns to a brief description of shale formations, layout of lateral wellbores within shale formation, and mineral lease boundary issues that complicate planning layout of lateral wellbores within shale formations.

Shale formations are hydrocarbon bearing formations characterized by a generally horizontal layering pattern and low permeability to the flow hydrocarbons. In order to produce hydrocarbons from shale formations, wells with lateral sections (hereafter just "laterals" or "lateral wellbores") which follow the layering pattern within the shale formation are created, and the volume surrounding a lateral within the shale formation is hydraulically fractured. The hydraulic fracturing is thought to open pathways for the hydrocarbons to flow into the well for production. Thus, in order to extract hydrocarbons over a large portion a shale formation, a series of substantially parallel lateral wellbores is created, where each well is hydraulically fractured. An ideal layout for such parallel lateral wellbores is square or rectangular, but rarely do boundaries of mineral rights define boundaries that align nicely with drilling parallel lateral wellbores.

In most legal jurisdictions (e.g., a state in the United States), mineral rights are associated with the legal real-property boundaries defined on the surface. If, for example, a purchase of a parcel of land is made and the mineral rights are included with the parcel, then the boundaries for the mineral rights may be considered to be the surface boundaries for the parcel of land projected downward into the Earth. Surface boundaries vary greatly, and might be defined by surfaces features such as the path of river, a range of tops of hills or mountains, or various straight line sections defined by surface features. The point is, in many cases the boundary for mineral rights defines an irregular polygon (i.e., something other than a square or rectangle), and selecting a layout of lateral wellbores that provides for economical creation of the lateral wellbores and good overall extraction of the hydrocarbons can be a time consuming task.

Consider, for purposes of explanation of various terms, FIG. 1. FIG. 1 shows an overhead view of a boundary 100 of mineral rights, as well as a layout of lateral wellbores within the boundary. In some cases the mineral rights within a boundary may be continuous mineral rights, and in other cases the mineral rights may be a conglomeration of mineral rights obtained from different owners. In the example case of FIG. 1, the boundary 100 defines a regular polygon in the form of a rectangle, but the various example systems below operate with respect to irregular and non-intersecting polygons (hereafter just "irregular polygons").

Within the illustrative boundary 100 is a proposed layout of lateral wellbores, along with a proposed pad site. In particular, FIG. 1 shows a single proposed pad site 102, which in the example of FIG. 1 is shown centered within the boundary 100. Other locations are possible, even for the rectangular boundary 100. The pad site 102 represents a surface location at which a drilling rig is placed during drilling of the lateral wellbores, and once the wells are completed the pad site 102 will be the location at which the wellheads reside. In some cases, all the lateral wellbores may be drilled from single vertical wellbore section (i.e., a kickoff for each lateral wellbore). In other cases, multiple vertical wellbores sections may be used, where two or more (but less than all) lateral wellbores are drilled from a vertical wellbore section. In yet still other cases each lateral wellbore may be associated with an individual vertical wellbore section. Thus, the pad site 102 may represent a series of relatively closely spaced locations at which vertical wellbores sections (leading to the lateral wellbores) are drilled.

Extending from the example pad site 102 is a set of proposed lateral wellbores 104 (only 104A and 104B specifically marked). When drilled, the lateral wellbores 104 reside at least partially within a shale formation, and thus the proposed layout of lateral wellbores of FIG. 1 (and like views below) are not meant to convey depth information. Each proposed lateral wellbore 104 has a heel portion 106 and a toe portion 108. The heel portion 106 represents a curved portion where the wellbore will turn into the final substantially straight portion within the shale formation, and the toe portion 108 represents the distal end of the substantially straight portion of the lateral wellbore. Each proposed lateral wellbore 104 resides along a particular azimuthal direction. That is, the substantially straight portion of each proposed lateral wellbore extends in a direction relative to a reference direction (such as true north as shown in FIG. 1). Consider, for example, proposed lateral wellbore 104A. In relation to North as shown, the substantially straight portion of the lateral wellbore 104A is to be drilled in a 270 degree or west direction. For purposes of this specification and claims, both the direction of drilling, and its reciprocal, are considered the same azimuthal direction. Thus, the azimuthal direction of proposed lateral wellbore 104B (which will be drilled in a 90 degree or east direction) shall be considered the same as the azimuthal direction as proposed lateral wellbore 104A.

In the example planned layout of lateral wellbores each lateral wellbore is shown parallel to the other lateral wellbores. In practice, actually drilling lateral wellbores to be exactly parallel is difficult for a variety of reasons, and thus lateral wellbores drilled according to the planned layout of FIG. 1 will be considered to be parallel. In some example situations, the layout of lateral wellbores may fan outward slightly to provide better coverage of the shale formation within an irregular polygon defining a boundary, but so long as the azimuthal directions are within 10 degrees of cardinal direction of each other, the lateral wellbores shall be considered parallel for purposes of the disclosure and claims.

FIG. 2 shows an overhead view of an example boundary of mineral rights. In particular, FIG. 2 shows boundary 200 of mineral rights in the form of an irregular non-intersecting polygon. While planning the layout of lateral wellbores in the case of FIG. 1 is a trivial case, planning the layout of lateral wellbores for the example boundary 200 of FIG. 2 is non-trivial. Software techniques for planning an overall layout of lateral wellbores prior to the current disclosure attempt to treat a boundary as a single unit in relation to a pad site, with all planned lateral wellbores having the same azimuthal direction (taking into consideration that the reciprocal headings are considered the same). For example, related-art software routines may plan layouts of the lateral wellbores such as shown in the various examples of FIG. 3. Overall layout 300 has all the lateral wellbores on a north/south azimuthal heading, but deficiencies in coverage exist. For example, no lateral wellbores exist in area 302, likely because there is insufficient lateral portion to justify the cost of wellbores in that area. The lateral wellbores fail to extend into area 304, likely because practical length of lateral wellbores is limited. Areas 306 and 308 would be unreachable (because of the boundary) and/or the lateral portion would be too short to justify the drilling in the example layout. Overall layout 310 has all the lateral wellbores an approximately a 030/210 degree azimuthal heading, but again deficiencies in coverage exist. For example, lateral wellbores fail to extend into areas 312 and 314, likely because there is insufficient lateral portion to justify the cost of wellbores in those areas. Similar issues existing with respect to layout 320.

Returning to FIG. 2, in accordance with example embodiments, planning an overall layout of the lateral wellbores within example boundary 200 starts with logically dividing the boundary 200 into a plurality of contiguous sub-areas. In some example systems, the logically dividing the boundary 200 into contiguous sub-areas begins by selecting at least one location for a pad site (such as location 202) within the boundary. A pad site may be selected based one or a combination of criteria, such as area defined by the boundary 200, surface hazards (e.g., homes, highways, bodies of water), a range of preferred azimuthal directions for lateral wellbores based on subsurface stress within the shale formation, and hazards within the overburden of the shale formation (e.g., faults, aquifers). In one case, the location 202 of the pad site may be selected based on a calculation of the two-dimensional geometric center of the boundary 200 (assuming no surface or overburden hazard would negate the selection). In yet still other cases, the geometric center may be selected, and logically dividing based on the geometric center, but the geometric center need not be a planned or actually pad site. In other example systems, one or more pad site locations within the boundary may be predetermined and provided to the computer system that performs the logically dividing into contiguous sub-areas.

Regardless of whether the example location 202 is determined by the computer system, provided to the computer system as a predetermined pad site location, or the location 202 is merely a geometric center not intended to be a pad site, the computer system then logically divides the boundary into a plurality of contiguous sub-areas taking into account the location 202. In accordance with example systems, logically dividing may involve selecting angles or inflection points defined by the boundary 200. In some example systems, the angles selected are reflex angles (i.e., angles that span more than 180 degrees) as viewed from within the boundary 200. In the example boundary of FIG. 2, three reflex angles are present—angle 204, angle 206 and angle 208. In the example system, logically dividing the boundary 200 may involve extending imaginary lines from each reflex angle to the location 202.

Figure 4:
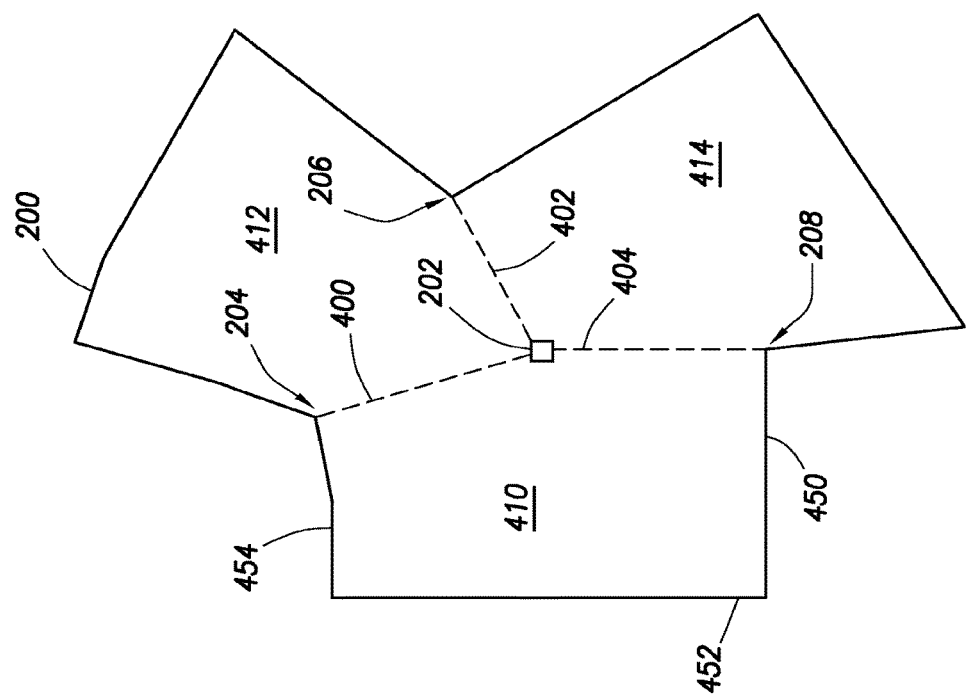
FIG. 4 shows an overhead view of the example boundary logically divided into sub-areas in accordance with at least some embodiments.

FIG. 4 shows an overhead view of an example boundary of mineral rights. In particular, FIG. 4 shows example boundary 200, location 202, as well as a set of logical divisions drawn between the reflex angles and the location 202. Dashed line 400 extends between reflex angle 204 and location 202. Dashed line 402 extends between reflex angle 206 and location 202. Dashed line 404 extends between reflex angle 208 and location 202. The dashed lines 400-404 logically divide the example boundary 200 into three logical sub-areas 410, 412, and 414. Once an initial logical division into sub-areas is made, the sub-areas may be evaluated. Any of a number of suitable criteria may be used to evaluate the logical sub-areas for sufficiency. In some systems logical sub-areas may be analyzed based on the relative size. For example, if one sub-area defines a significantly smaller area (e.g., square footage, surface equivalent acreage) than other sub-areas, then one of the reflex angles may be deselected (and the corresponding line removed) such that two previous contiguous sub-areas become a single sub-area of greater area in relation to the others.

As yet another example of evaluating the logical sub-areas, each sub-area may be evaluated based on whether the sub-area will support lateral wellbores of suitable number and length. That is, for a sub-area to be a suitable candidate for cost effective layout of lateral wellbores, a certain number of lateral wellbores within the sub-area may be desired, each lateral wellbore having at least a shortest economical length. For example, if a shale formation resides 4000 feet below the surface (meaning that a substantially vertical portion of the wellbore needs to extend at least 4000 feet before entering the shale formation), having a lateral portion within the shale formation of only a few hundred feet would likely produce sufficient cash flow to justify the well, as the cost of drilling the non-producing portion would not be supported by the potential production form the portion within the shale formation. Similar statements regarding the number of lateral wellbores within each sub-area logically follow.

Figure 5:
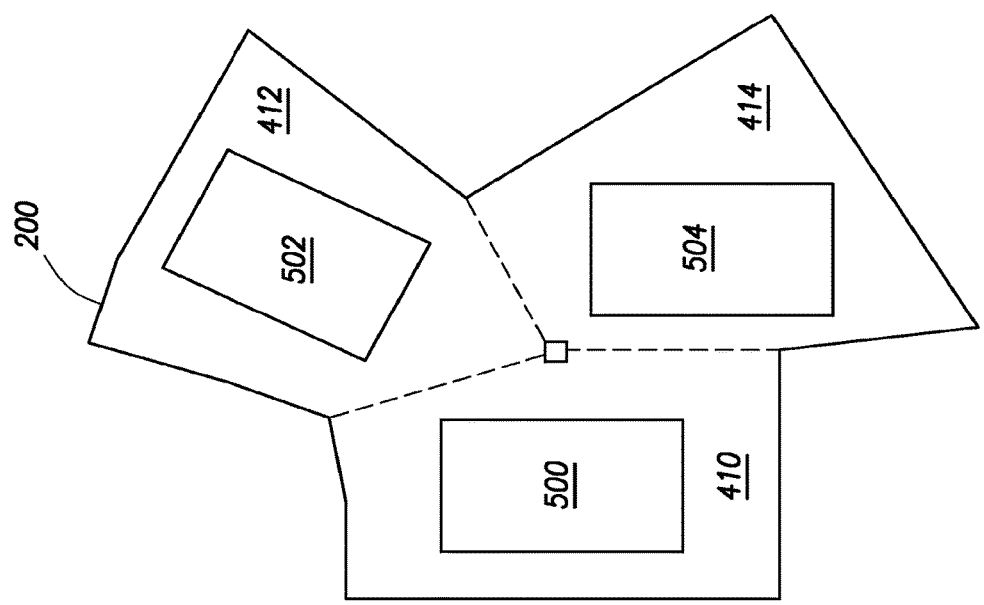
FIG. 5 shows an overhead view of the example boundary, and visually depicts an example method of testing sub-areas for sufficiency in accordance with example embodiments.

To evaluate for suitability regarding the number and length of wellbores that could be placed within a sub-area, some example systems evaluate each sub-area for sufficient continuous area. For example, a predetermined minimum number and length of lateral wellbores implies a square or rectangular area within which the lateral portions of the wellbores would reside. Evaluating each sub-area may thus involve programmatically evaluating whether a predefined continuous area can fit within a sub-area (with the understanding that, if supported, the planned layout of lateral wellbores will likely be larger). FIG. 5 shows the example boundary 200, and the example sub-areas 410, 412, and 414 of FIG. 4. Within each example sub-area 410, 412, and 414 is a rectangle 500, 502, and 504, respectively, where the rectangle represents a predetermined continuous area to support economical layout of lateral wellbores. Though rectangles are shown, the predefined continuous areas may likewise be squares, depending on the economics associated with drilling into a particular shale formation. The predetermined continuous area fits within each sub-area of the example boundary 200, and thus the example sub-areas 410, 412 and 414 may be suitable. In the event a predetermined continuous area does not fit within one of the sub-areas, the logical divisions may be recalculated (e.g., picking a different location 202, and opting not to select a particular previously selected reflex angle, which effectively combines previous sub-areas), and repeating the process. It is noted that the predetermined continuous area is not meant to imply an azimuthal direction of planned lateral wellbores within the sub-area. Once the sub-areas are selected and evaluated, the illustrative method moves to planning layouts of lateral wellbores within each sub-area.

Returning to FIG. 4, planning of layouts within a sub-area in example systems involves programmatically planning a plurality of layouts of lateral wellbores residing with the particular sub-area, each layout having a plurality of substantially parallel wellbores. Each planned layout of lateral wellbores may be along distinct azimuthal directions. From the plurality of layouts, a layout is selected based on predetermined selection criteria. Various example selection methodologies are discussed below, but for now the specification discusses selecting the azimuthal directions for each planned layout of lateral wellbores within a sub-area.

In accordance with examples systems, the computer system implementing the various embodiments selects azimuthal directions based on boundary lines that define the sub-area. More particularly, in example systems the computer system selects a boundary line that partially defines the sub-area, and plans layouts of lateral wellbores within a predetermined range of angles related to the azimuthal direction of the selected boundary line. Consider, as an example, sub-area 410 as shown in FIG. 4. Sub-area 410 is defined by five boundary lines—boundary line 450, boundary line 452, boundary line 454, dashed line 400, and dashed line 404. In some example systems, the boundary line selected is the boundary line having the longest dimension (and for purposes of selection, in some systems a dashed line is considered a boundary line when selecting the line with the longest dimension). In the example sub-area 410, boundary line 452 has the longest dimension, and thus may be initially selected. The azimuthal direction of the selected boundary line is determined (in the example of boundary line 452, 000/180 degrees), and a plurality of layouts of lateral wellbores is planned based on the azimuth of the selected boundary line. For example, a first layout may be planned based on the lateral wellbores being perpendicular to the azimuth of the selected boundary line. As another example, a layout may be planned based on the lateral wellbores being parallel to the selected boundary line. In the example of boundary line 452 being selected, a layout of lateral wellbores along the 270/090 degrees may be planned. Additional layouts within a predetermined range of azimuths may also be planned (e.g., 260/080 degrees, and 280/100 degrees).

Figure 6:
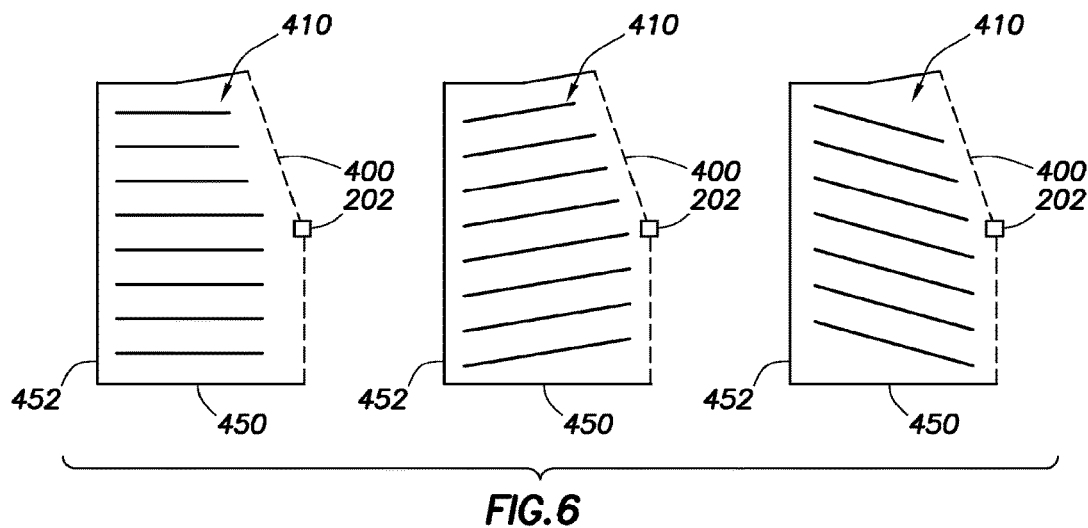
FIG. 6 shows overhead views of a sub-area of the example boundary, each sub-area shown with layouts of lateral wellbores with varying azimuthal directions, in accordance with at least some embodiments.

FIG. 6 shows the sub-area 410, and three example planned layouts within the sub-area, the example planned layouts based on a selection of boundary line 452. It is noted that the example planned layouts of FIG. 6 may be equivalently thought of as being based on a selection of boundary line 450 and planning within a range of angles based on parallel to the selected boundary line (the left most portion of the figure showing exactly parallel). Further still, the example planned layouts of FIG. 6 may be equivalently thought of as being based on a selection of a boundary line in the form of dashed line 400 and planning within a range of angles including perpendicular to the selected boundary line (the middle portion of the figure showing perpendicular). Moreover, the example planned layouts of FIG. 6 take into account that location 202 is a pad site. In the event the sub-area 410 is not constrained to have planned lateral wellbores originating from location 202 as a pad site, additional layouts may be evaluated (such as parallel to boundary line 452).

Selecting a layout from the plurality of layouts for a sub-area may be based on evaluation of selection criteria. For example, the overall coverage of each planned layout may be evaluated, and the layout with the best planned coverage (e.g., drainage area in relation to total area within a sub-area) within the sub-area selected. More particularly, each lateral wellbore can be considered to define a line segment. When hydraulic fracturing is completed, the "reach" of a field for a lateral wellbore extends outward from the lateral wellbore. Thus, in a two-dimensional sense, each lateral wellbore can be considered to "cover" or drain a particular area. All the lateral wellbores considered together may then be considered to "cover" or drain an overall area. Thus, a planned layout may be ranked based on the drainage area defined by the planned layout in relation to other planned layouts, or the sub-area as a whole.

In another case, the expected cost to drill the wellbores within each planned layout may be evaluated, and the layout that provides the lowest expected cost selected. For example, if a first planned layout along a particular azimuthal direction yields a sufficiently sized draining area with fewer lateral wellbores (and thus lower planned cost) than a second planned layout, the lowest cost planned layout may be selected. In yet still further cases, the coverage of a layout and the expected costs are considered together, and the layout that provides the best cost per unit of drainage area may be selected.

Selecting a layout of lateral wellbores may also take into account production aspects of each lateral wellbore of the planned lateral wellbores. For example, each wellbore in a planned layout of lateral wellbores may be evaluated, with the overall evaluation based on considering aspects of the all planned wellbores of a layout together. Consider, as an example, a planned wellbore whose lateral length (i.e., within the production zone) is shorter than an optimal length taking into account expected hydrocarbon production. Such a shorter-than-optimal length may incur a penalty in the evaluation of planned layout. Likewise, consider a planned wellbore whose lateral length reaches a maximum (e.g., drilled depth reaching operational limits), but where addition shale formation beyond the toe of the lateral to the boundary setback exists (and from which additional hydrocarbons could have been produced). Such a shorter-than-the-formation length may likewise incur a penalty in the evaluation of the planned layout.

Regardless of the precise predetermined selection criteria, a layout of the plurality of layouts is selected for the sub-area under consideration. The process is repeated for each sub-area, including planning a plurality of layouts for each sub-area, and selecting a layout of the plurality of layouts based on a selection criteria. The selected layouts for each sub-area are then combined create an overall layout of lateral wellbores for the boundary 200 being an irregular polygon. Finally, the overall layout may be provided to the human operator for evaluation, such as by displaying the overall layout on a display device.

Figure 7:
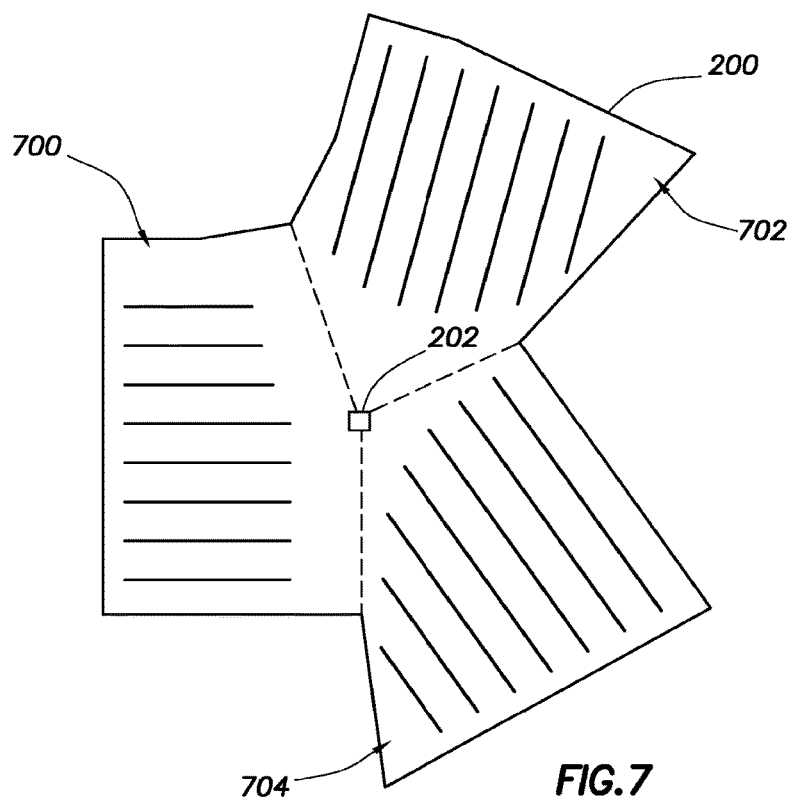
FIG. 7 shows an overhead view of an overall planned layout for the example boundary in accordance with at least some embodiments.

FIG. 7 shows an overhead view of an example overall planned layout. In particular, FIG. 7 shows an example overall planned layout for the illustrative boundary 200 logically divided into three sub-areas and assuming location 202 as a pad site. Notice how the layout of lateral wellbores in each of the sub-area resides along different azimuthal directions. While the example overall planned layout of FIG. 7 has gaps in coverage (e.g., areas 700, 702, and 704), the coverage provided by the exampled planned layout of FIG. 7 is more inclusive than planned layouts where the all the lateral wellbores are constrained to the same azimuthal directions (FIG. 3).

In accordance with some example systems, once the overall layout with parallel lateral wellbores in each sub-area is completed, the process is complete for the boundary. However, in yet still further example systems, the overall layout may be modified to "fan out" slightly. In particular, where areas exist between an overall layout and the boundary where no drainage is provided, the layout of lateral wellbores may be expanded in a fashion that spreads out the planned wellbores. Programmatically, the location of the ends (e.g., the toe ends) of each lateral wellbore within a sub-area may shifted toward the area. If the drainage area of a particular wellbore is assumed constant, the "fan out" does not result in better overall drainage; however, in practice lateral wellbores are hydraulically fractured in stages, and in situations where there is more distance between laterals wellbores at certain locations, more aggressive hydraulic fracturing may be implemented in an attempt to expand the drainage areas in certain locations.

Figure 8:
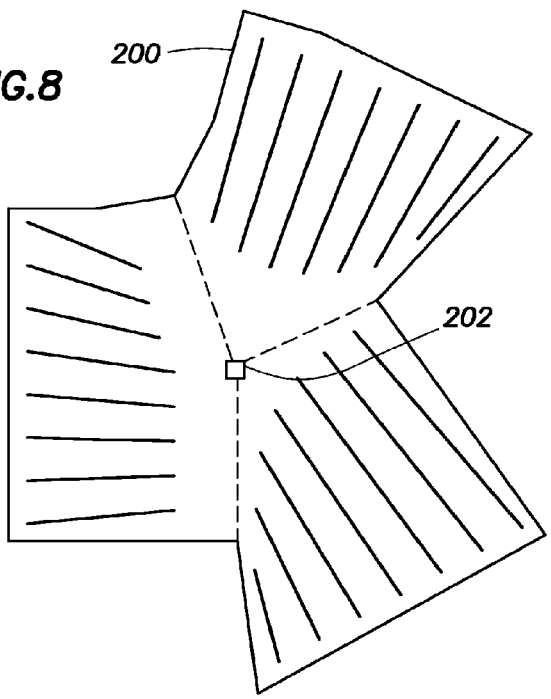
FIG. 8 shows an overhead view of an overall planned layout after implementing a fan-out of laterals in accordance with at least some embodiments.

FIG. 8 shows an overhead view of an example overall planned layout that includes a "fan out" of the planned layout. In particular, FIG. 8 shows an example overall planned layout for the illustratively boundary 200 logically divided into three sub-areas and assuming location 202 as a pad site. Notice how the layout of lateral wellbores in each of the sub-area resides along different azimuthal directions, but notice also how the planned lateral wellbores fan out with increasing distance from the location 202 of the pad site. It is noted that the fan out is not limited to the toe ends of the laterals, and fan out of the heel ends is also possible (but less likely in practice because the heel end fan outs increase the drilled length the vertical portion of a well). The example overall planned layout of FIG. 8 has fewer perceived gaps in coverage than the coverage provided by the exampled planned layout of FIG. 7.

Figure 9:
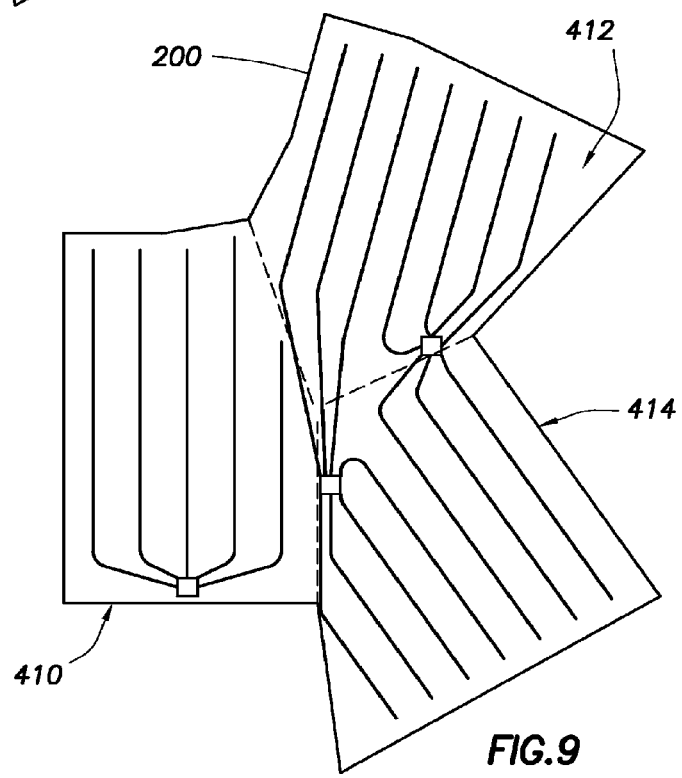
FIG. 9 shows an overhead view of an overall layout where the planning is not constrained to particular pad site in accordance with at least some embodiments.

The example boundary 200 and overall planned layout resulting in FIGS. 7 and/or 8 was described in the context of the computer system designing the layout being constrained to the location 202 being a pad site from which all the lateral wellbores originate. However, in other example systems the computer system performing the method may not be so constrained, and such a lack of constraint as to pad site may enable the computer system to find better overall layouts, judged at least from a coverage perspective. For example, FIG. 9 shows an overhead view of an example overall planned layout programmatically constructed without the constraint of single predetermined location of a pad site. In the case of example sub-areas 412 and 414, the lack of constraint does not change the number and/or azimuthal directions of the planned lateral wellbores, but does extend length of the wellbores (owing to the more favorable pad placement). For example, in sub-area 414 the lateral wellbores have the same azimuthal direction as FIG. 7, but in the western portion have greater length. Likewise, in example sub-area 412 the lateral wellbores have the same azimuthal direction as FIG. 7, but the center-most lateral wellbores have extended length. In sub-area 410 the lateral wellbores have a different azimuthal direction, fewer laterals are present, but the length of each lateral wellbore is extended as compared to FIG. 7. Thus, in some example systems the planned layout within each sub-area is selected without regard to pad site locations. After the overall layout is created by selecting a layout within each sub-area, the pad sites may be determined to accommodate the planned layout of lateral wellbores.

Figure 10:
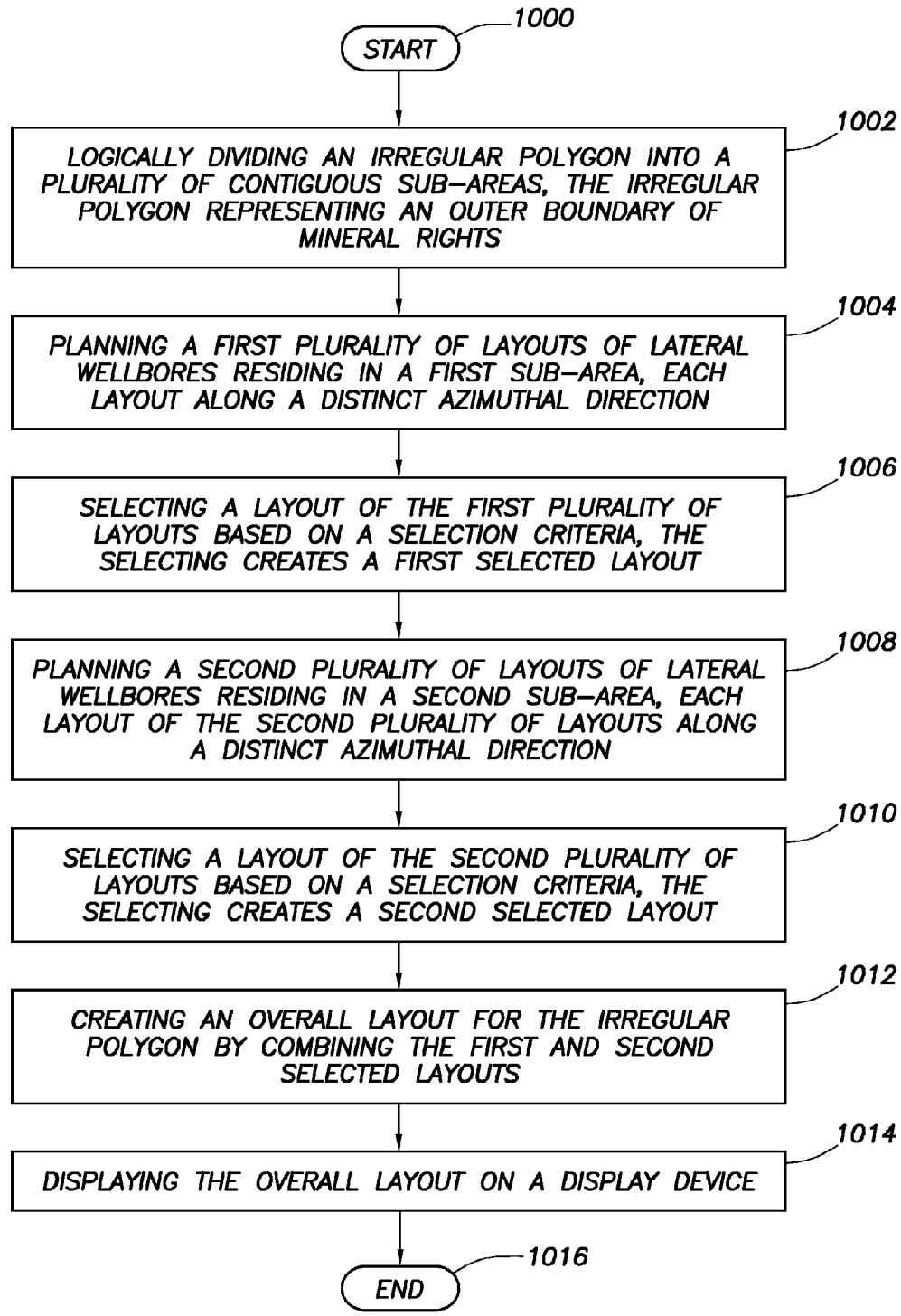
FIG. 10 shows a method in accordance with at least some embodiments.

FIG. 10 shows a computer-implemented method in accordance with at least some embodiments. In particular, the method starts (block 1000) and comprises: logically dividing an irregular polygon into a plurality of contiguous sub-areas, the irregular polygon representing an outer boundary of mineral rights (block 1002); planning a first plurality of layouts of lateral wellbores residing in a first sub-area, each layout along a distinct azimuthal direction (block 1004); selecting a layout of the first plurality of layouts based on a selection criteria, the selecting creates a first selected layout (block 1006); planning a second plurality of layouts of lateral wellbores residing in a second sub-area, each layout of the second plurality of layouts along a distinct azimuthal direction (block 1008); selecting a layout of the second plurality of layouts based on a selection criteria, the selecting creates a second selected layout (block 1010); creating an overall layout for the irregular polygon by combining the first and second selected layouts (block 1012); and displaying the overall layout on a display device (block 1014). Thereafter the methods ends (block 1016), possibly to be immediately restarted on a different boundary or with different parameters.

Figure 11:
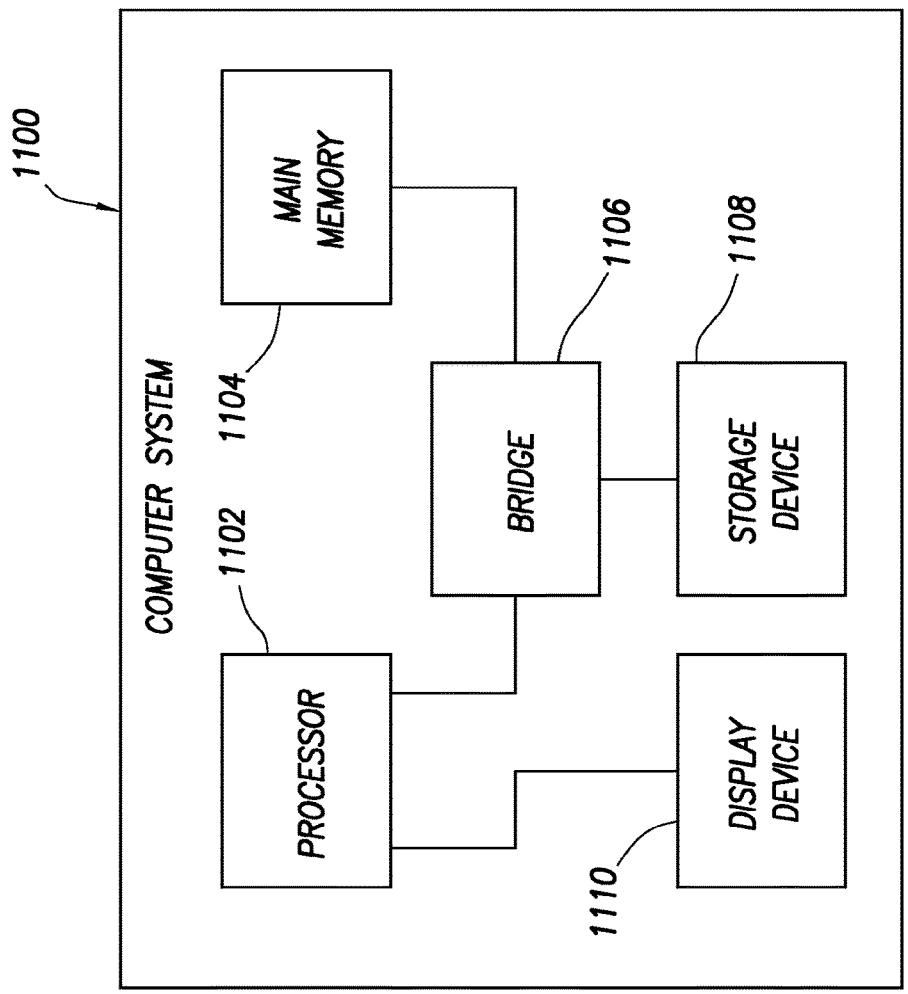
FIG. 11 show a computer system in accordance with at least some embodiments.

FIG. 11 illustrates in greater detail a computer system 1100 which may be used create the overall planned layouts of lateral wellbores for a boundary. The computer system 1100 comprises a processor 1102. The processor couples to a display device 1110, and also couples to a main memory 1104 by way of a bridge device 1106. It is on the display device 1110 that the various overall planned layout of lateral wellbores, or intermediate versions thereof, may be displayed. Moreover, the processor 1102 may couple to a long term storage device 1108 (e.g., a hard drive, solid state disk, memory stick, optical disc) by way of the bridge device 1106. Programs executable by the processor 1102 may be stored on the storage device 1108, and accessed when needed by the processor 1102. In some cases, the programs are copied from the storage device 1108 to the main memory 1104, and the programs are executed from the main memory 1104. Thus, the main memory 1104 and storage device 608 shall be considered computer-readable storage mediums.

At least embodiments are methods comprising: logically dividing an irregular polygon into a plurality of contiguous sub-areas, the irregular polygon representing an outer boundary of mineral rights, and the logically dividing by a computer system; planning a first plurality of layouts of lateral wellbores residing in a first sub-area, each layout along a distinct azimuthal direction, the planning by the computer system; selecting a layout of the first plurality of layouts based on a selection criteria, the selecting creates a first selected layout; planning a second plurality of layouts of lateral wellbores residing in a second sub-area, each layout of the second plurality of layouts along a distinct azimuthal direction, and the planning by the computer system; selecting a layout of the second plurality of layouts based on a selection criteria, the selecting creates a second selected layout; and creating an overall layout for the irregular polygon by combining the first and second selected layouts, the creating by the computer system; and displaying the overall layout on a display device.

Other embodiments may also comprise logically dividing based on a predetermined location of a pad site within the irregular polygon.

Other embodiments may also comprise: selecting a pad site within the irregular polygon; and then logically dividing based on the pad site.

Other embodiments may also comprise selecting the pad site is based on at least one selected from the group consisting of: avoidance of a surface hazard; a calculation of a two-dimensional geometric center location.

Other embodiments may also comprise: selecting a center location within the irregular polygon; and then logically dividing based on the center location.

Other embodiments may also comprise: identifying within the first sub-area a boundary line of the first sub-area; and then planning the first plurality of layouts within a predetermined range of angles related to azimuth of the boundary line.

Other embodiments may also comprise: planning the first plurality of layouts within a predetermined range of angles that includes perpendicular to the boundary line.

Other embodiment may also comprise: planning the first plurality of layouts within a predetermined range of angles that includes parallel to the boundary line.

Other embodiment may also comprise: identifying a boundary of the first sub-area having a longest dimension as compared to other boundaries of the sub-area; and setting the boundary having the longest dimension as the boundary line.

Other embodiment be computer systems comprising: a processor; a memory coupled to the processor; a display device coupled to the processor. The memory storing a program that, when executed by the processor, causes the processor to: divide an irregular polygon into a plurality of contiguous sub-areas, the irregular polygon representing an outer boundary of mineral rights; plan a first plurality of layouts of lateral wellbores residing in a first sub-area, each layout along a distinct azimuthal direction; select a layout of the first plurality of layouts based on a selection criteria, the selecting creates a first selected layout; plan a second plurality of layouts of lateral wellbores residing in a second sub-area, each layout of the second plurality of layouts along a distinct azimuthal direction; select a layout of the second plurality of layouts based on a selection criteria, the selecting creates a second selected layout; create an overall layout for the irregular polygon by combining the first and second selected layouts; and display the overall layout on a display device.

The program may also cause the processor to divide based on a predetermined location of a pad site within the irregular polygon.

The program may also cause the processor to: select a pad site within the irregular polygon; and then divide based on the pad site.

The program may also cause the processor to select the pad site based on at least one selected from the group consisting of: avoidance of a surface hazard; a calculation of a two-dimensional geometric center location.

The program may also cause the processor to: identify within the first sub-area a boundary line of the first sub-area; and then plan the first plurality of layouts within a predetermined range of angles related to azimuth of the boundary line.

The program may also cause the processor to plan the first plurality of layouts within a predetermined range of angles that includes perpendicular to the boundary line.

The program may also cause the processor to plan the first plurality of layouts within a predetermined range of angles that includes parallel to the boundary line.

The program may also cause the processor to: identify a boundary of the first sub-area having a longest dimension as compared to other boundaries of the sub-area; and set the boundary having the longest dimension as the boundary line.

Other embodiments are computer-readable mediums storing instructions that, when executed by a processor, cause the processor to: divide an irregular polygon into a plurality of contiguous sub-areas, the irregular polygon representing an outer boundary of a set mineral rights; plan a first plurality of layouts of lateral wellbores residing in a first sub-area, each layout along a distinct azimuthal direction; select a layout of the first plurality of layouts based on a selection criteria, the selecting creates a first selected layout; plan a second plurality of layouts of lateral wellbores residing in a second sub-area, each layout of the second plurality of layouts along a distinct azimuthal direction; select a layout of the second plurality of layouts based on a selection criteria, the selecting creates a second selected layout; create an overall layout for the irregular polygon by combining the first and second selected layouts; and display the overall layout on a display device.

The program may also cause the processor to divide based on a predetermined location of a pad site within the irregular polygon.

The program may also cause the processor to: select a pad site within the irregular polygon; and then divide based on the pad site.

The program may also cause the processor to select the pad site based on at least one selected from the group consisting of: avoidance of a surface hazard; a calculation of a two-dimensional geometric center location.

The program may also cause the processor to: identify within the first sub-area a boundary line of the first sub-area; and then plan the first plurality of layouts within a predetermined range of angles related to azimuth of the boundary line.

The program may also cause the processor to plan the first plurality of layouts within a predetermined range of angles that includes perpendicular to the boundary line.

The program may also cause the processor to plan the first plurality of layouts within a predetermined range of angles that includes parallel to the boundary line.

The program may also cause the processor to: identify a boundary of the first sub-area having a longest dimension as compared to other boundaries of the sub-area; and set the boundary having the longest dimension as the boundary line.

It is noted that while theoretically possible to perform some or all the calculations discussed above by a human using only pencil and paper, the time measurements for human-based performance of such tasks may range from man-hours to man-years, if not more. Thus, this paragraph shall serve as support for any claim limitation now existing, or later added, setting forth that the period of time to perform any task described herein less than the time required to perform the task by hand, less than half the time to perform the task by hand, and less than one quarter of the time to perform the task by hand, where "by hand" shall refer to performing the work using exclusively pencil and paper.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments and/or to create a non-transitory computer-readable medium (i.e., not a carrier wave) that stores a software program to implement the method aspects of the various embodiments.

References to "one embodiment," "an embodiment," "some embodiment," "various embodiments," "example systems," or the like indicate that a particular element or characteristic is included in at least one embodiment of the invention. Although the phrases may appear in various places, the phrases do not necessarily refer to the same embodiment.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
   logically dividing an irregular polygon into a plurality of contiguous sub-areas, the irregular polygon representing an outer boundary of mineral rights, and the logically dividing by a computer system;
   planning a first plurality of layouts of lateral wellbores residing in a first sub-area, each layout along a distinct azimuthal direction, the planning by the computer system;
   selecting a layout of the first plurality of layouts based on a selection criteria, the selecting creates a first selected layout;
   planning a second plurality of layouts of lateral wellbores residing in a second sub-area, each layout of the second plurality of layouts along a distinct azimuthal direction, and the planning by the computer system;
   selecting a layout of the second plurality of layouts based on a selection criteria, the selecting creates a second selected layout;
   combining the first and second selected layouts to create an overall layout for lateral wellbores within the outer boundary of mineral rights represented by the irregular polygon, the combining by the computer system;
   displaying the overall layout on a display device; and
   drilling one or more of the lateral wellbores within the outer boundary of mineral rights according to the overall layout.

2. The method of claim 1 wherein logically dividing further comprises logically dividing based on a predetermined location of a pad site within the irregular polygon.

3. The method of claim 1 wherein logically dividing further comprises:

selecting a pad site within the irregular polygon; and then logically dividing based on the pad site.

4. The method of claim 3 wherein selecting the pad site is based on at least one selected from the group consisting of: avoidance of a surface hazard; a calculation of a two-dimensional geometric center location.

5. The method of claim 1 wherein logically dividing further comprises:
 selecting a center location within the irregular polygon; and then
 logically dividing based on the center location.

6. The method of claim 1 wherein planning the first plurality of layouts further comprises:
 identifying within the first sub-area a boundary line of the first sub-area; and then
 planning the first plurality of layouts within a predetermined range of angles related to azimuth of the boundary line.

7. The method of claim 6 wherein planning the first plurality of layouts further comprises planning the first plurality of layouts within a predetermined range of angles that includes perpendicular to the boundary line.

8. The method of claim 6 wherein planning the first plurality of layouts further comprises planning the first plurality of layouts within a predetermined range of angles that includes parallel to the boundary line.

9. The method of claim 6 wherein identifying the boundary line further comprises:
 identifying a boundary of the first sub-area having a longest dimension as compared to other boundaries of the sub-area; and
 setting the boundary having the longest dimension as the boundary line.

10. A computer system comprising:
 a processor;
 a memory coupled to the processor;
 a display device coupled to the processor;
 the memory storing a program that, when executed by the processor, causes the processor to:
 divide an irregular polygon into a plurality of contiguous sub-areas, the irregular polygon representing an outer boundary of mineral rights;
 plan a first plurality of layouts of lateral wellbores residing in a first sub-area, each layout along a distinct azimuthal direction;
 select a layout of the first plurality of layouts based on a selection criteria, the selecting creates a first selected layout;
 plan a second plurality of layouts of lateral wellbores residing in a second sub-area, each layout of the second plurality of layouts along a distinct azimuthal direction;
 select a layout of the second plurality of layouts based on a selection criteria, the selecting creates a second selected layout;
 combine the first and second selected layouts to create an overall layout for lateral wellbores within the outer boundary of mineral rights represented by the irregular polygon;
 display the overall layout on the display device; and
 drill one or more of the lateral wellbores within the outer boundary of mineral rights according to the overall layout.

11. The computer system of claim 10 wherein when the processor divides, the program causes the processor to divide based on a predetermined location of a pad site within the irregular polygon.

12. The computer system of claim 10 wherein when the processor divides, the program causes the processor to:
 select a pad site within the irregular polygon; and then
 divide based on the pad site.

13. The computer system of claim 12 wherein when the processor selects, the program causes the processor to select the pad site based on at least one selected from the group consisting of: avoidance of a surface hazard; a calculation of a two-dimensional geometric center location.

14. The computer system of claim 10 wherein when the processor plans the first plurality of layouts, the program causes the processor to:
 identify within the first sub-area a boundary line of the first sub-area; and then
 plan the first plurality of layouts within a predetermined range of angles related to azimuth of the boundary line.

15. The computer system of claim 14 wherein when the processor plans the first plurality of layouts, the program causes the processor to plan the first plurality of layouts within a predetermined range of angles that includes perpendicular to the boundary line.

16. The computer system of claim 14 wherein when the processor plans the first plurality of layouts, the program causes the processor to plan the first plurality of layouts within a predetermined range of angles that includes parallel to the boundary line.

17. The computer system of claim 14 wherein when the processor identifies the boundary line, the program causes the processor to:
 identify a boundary of the first sub-area having a longest dimension as compared to other boundaries of the sub-area; and
 set the boundary having the longest dimension as the boundary line.

18. A non-transitory computer-readable medium storing instructions that, when executed by a processor, cause the processor to:
 divide an irregular polygon into a plurality of contiguous sub-areas, the irregular polygon representing an outer boundary of a set mineral rights;
 plan a first plurality of layouts of lateral wellbores residing in a first sub-area, each layout along a distinct azimuthal direction;
 select a layout of the first plurality of layouts based on a selection criteria, the selecting creates a first selected layout;
 plan a second plurality of layouts of lateral wellbores residing in a second sub-area, each layout of the second plurality of layouts along a distinct azimuthal direction;
 select a layout of the second plurality of layouts based on a selection criteria, the selecting creates a second selected layout;
 combine the first and second selected layouts to create an overall layout for lateral wellbores within the outer boundary of mineral rights represented by the irregular polygon;
 display the overall layout on a display device; and
 drill one or more of the lateral wellbores within the outer boundary of mineral rights according to the overall layout.

19. The non-transitory computer-readable medium of claim 18 wherein when the processor divides, the program causes the processor to divide based on a predetermined location of a pad site within the irregular polygon.

20. The non-transitory computer-readable medium of claim 18 wherein when the processor divides, the program causes the processor to:

select a pad site within the irregular polygon; and then divide based on the pad site.

21. The non-transitory computer-readable medium of claim 20 wherein when the processor selects, the program causes the processor to select the pad site based on at least one selected from the group consisting of: avoidance of a surface hazard; a calculation of a two-dimensional geometric center location.

22. The non-transitory computer-readable medium of claim 18 wherein when the processor plans the first plurality of layouts, the program causes the processor to:
   identify within the first sub-area a boundary line of the first sub-area; and then
   plan the first plurality of layouts within a predetermined range of angles related to azimuth of the boundary line.

23. The non-transitory computer-readable medium of claim 22 wherein when the processor plans the first plurality of layouts, the program causes the processor to plan the first plurality of layouts within a predetermined range of angles that includes perpendicular to the boundary line.

24. The non-transitory computer-readable medium of claim 22 wherein when the processor plans the first plurality of layouts, the program causes the processor to plan the first plurality of layouts within a predetermined range of angles that includes parallel to the boundary line.

25. The non-transitory computer-readable medium of claim 22 wherein when the processor identifies the boundary line, the program causes the processor to:
   identify a boundary of the first sub-area having a longest dimension as compared to other boundaries of the sub-area; and
   set the boundary having the longest dimension as the boundary line.

\* \* \* \* \*